United States Patent [19]

Comerford et al.

[11] 4,047,124
[45] Sept. 6, 1977

[54] PLANAR SOLID STATE LASER ARRAY

[75] Inventors: Liam David Comerford, Croton-on-Hudson; Peter Stephen Zory, Jr., Ossining, both of N.Y.

[73] Assignee: International Business Machines Corporation, Armonk, N.Y.

[21] Appl. No.: 645,851

[22] Filed: Dec. 31, 1975

[51] Int. Cl.² .............................................. H01S 3/19
[52] U.S. Cl. .......................... 331/94.5 H; 331/94.5 C; 357/18
[58] Field of Search .................... 331/94.5 C, 94.5 H; 330/4.3; 357/16, 18

[56] References Cited

U.S. PATENT DOCUMENTS 3,257,626   6/1966   Marinace et al. .............. 331/94.5 H

OTHER PUBLICATIONS

Matzelle, RCA Tech. Notes, No. 730, Jan. 1968, 2 sheets.
Scifres et al., Applied Physics Letters, vol. 26, No. 2, Jan. 15, 1975, pp. 48–50.
Dobkin et al., Soviet Physics -Semiconductors, vol. 4, No. 3, Sept. 1970, pp. 515–516.
Kazarinov et al., Soviet Physics–Semiconductors, vol. 6, No. 7, Jan. 1973, pp. 1184–1189.

*Primary Examiner*—Michael J. Lynch
*Assistant Examiner*—James W. Davie
*Attorney, Agent, or Firm*—Robert E. Sandt

[57] ABSTRACT

An array of collimated wise aperture electrically pumped leaky corrugated AlGaAs optical waveguide lasers is formed on a single chip by etching a series of grooves oriented with respect to the crystalographic planes to isolate discrete lasers in the array and provide the requisite orientation of the internal reflecting surfaces to support the lasing action. The corrugation period is chosen such that the laser radiation exits from the array in a direction normal to the plane of waveguide.

2 Claims, 3 Drawing Figures

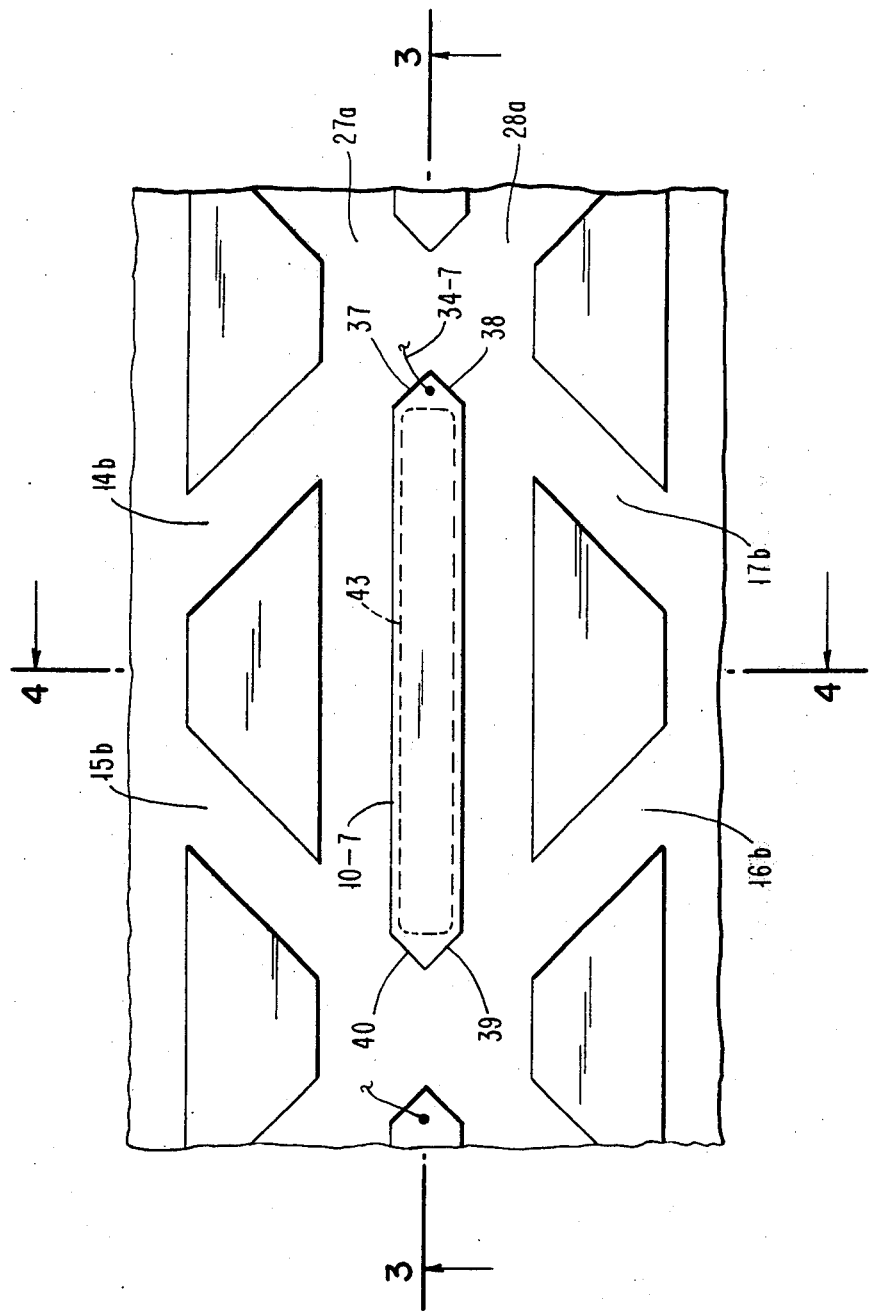

PLANAR SOLID STATE LASER ARRAY

BACKGROUND OF THE INVENTION

1. Field of the Invention

The present invention relates to lasers and, more particularly, to a solid state laser array and the method of fabricating such an array.

2. Prior Art

In an electrically pumped multi-heterojunction laser, the radiation usually exits in a direction parallel to the junctions. In a single laser, this offers no problems. However, when a multiplicity of lasers is to be deployed in a matrix array on a common substrate, the direction of radiation places restrictions upon the fabricating techniques.

One patentee, M. Borner, sought to solve this problem in U.S. Pat. No. 3,614,661 by deploying a plurality of individual lasers on a common substrate with the plane of the laser junctions perpendicular to the plane of the substrate. It is to be noted that the active layers in the lasers all lie in different planes and cannot therefore be deposited in common upon the substrate.

In the instant invention, the junctions for all of the lasers in the array lie in the same plane. Therefore, the various laminae constituting the lasers may be deposited in common upon the substrate. This allows for economical mass fabrication techniques using solid state device deposition techniques. Separation of the individual lasers by preferential etching provides not only the requisite resonant cavity geometry, but also the requisite isolation of the lasers. A periodic grating whose plane is parallel to the junctions induces a leaky coupling of the radiation out of each laser in a direction perpendicular to the plane of the array.

SUMMARY OF THE INVENTION

It is an object of this invention to provide an array of individual electrically pumped solid state lasers wherein the active lamina of each laser lies in a plane common to all laminae of all lasers in the array, and the individual lasers are optically and electrically isolated by a predetermined geometric pattern of grooves whose walls define a resonant cavity in each laser.

A further object is to provide an array in accordance with the preceding object in which light is coupled out of each laser in the array in a direction normal to the plane of the array by means of a periodic grating.

Another object of the invention is to provide a method of fabrication for the foregoing laser array wherein all of the laser material is fabricated in a unitary form by a succession of deposition steps and then physically defined by further etching operations.

The foregoing and other objects of the present invention will be apparent from the more particular description of the preferred embodiment of the invention, as illustrated in the accompanying drawings.

BRIEF DESCRIPTION OF THE DRAWINGS

FIG. 2 is a large scale plan view of a single island.

FIG. 1 illustrates a typical planar array of individual lasers 10-1 to 10-12 deployed as discrete islands on a common substrate or chip. The laser material is fabricated by depositing the requisite successive layers on a substrate, the materials, the method of deposition, and the layer thicknesses being essentially the same as those employed in a double heterostructure (DH) continuous-wave room temperature laser. The lasers are defined and optically and electrically isolated by means of a geometric pattern of grooves. These grooves not only isolate the laser islands but also, because of the choice of crystal orientation, provide, through preferential crystalographic etching, the reflecting surfaces in each island which compel total internal reflection and thus provide the reflecting cavity necessary to support the lasing action.

Figure 1:
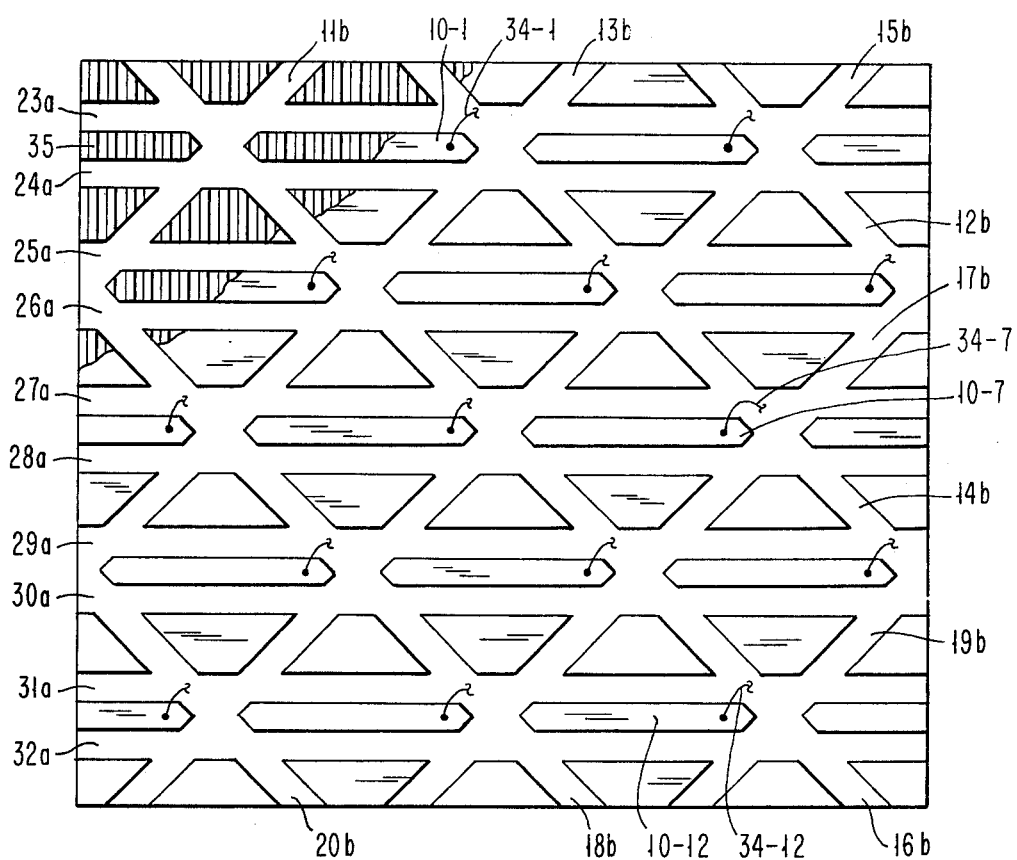
FIG. 1 is an overall plan view of the array with the corrugations exposed in the upper left corner.

The top and bottom layers of the array consist of electrodes to which a potential is applied to induce the lasing action in the manner of a DH laser. The electrical isolation of the top layer allows each laser to be individually potentialized. Normally, a DH laser couples the radiation out of the laser in a direction parallel to the junctions. In a planar array such as that shown in FIG. 1, the various laminae and junctions all lie in planes parallel to the plane of the paper. Therefore, additional structural provision must be made to couple the radiation out of each laser in a direction normal to these planes. This is done by etching a diffraction grating on the surface of the final dielectric layer prior to deposition of the top electrode. This grating in the top surface and an exit aperture in the lower surface couple the lasers' radiation out of the planar array in a downward normal direction. In some cases it may be desirable to leave an opening in the top electrode, either for better control of the lasing circuit or to provide an exit aperture for radiation.

Specifically, and with reference to all the figures, a wafer 30 of gallium arsenide is most conveniently obtained from a specialty vendor dealing in crystals of this kind. The crystal orientation is specified as having its (100) and ($\bar{1}$00) planes parallel to the major surfaces of the chip, the top and bottom respectively as shown in the figures. Upon this substrate are successively deposited by epitaxial deposition, the $Al_xGa_{1-x}As$ lower buffer layer 31, the $Al_yGa_{1-y}As$ active layer 32, and the $Al_zGa_1$—As buffer layer 33. The structure resulting from these series of steps and the processes and materials employed are substantially the same as those in a DH AlGaAs diode laser. A diffraction grating 35 is then etched as a series of parallel V-shaped grooves into the upper surface of the AlGaAs layer 33 using the techniques described by the instant inventors in Applied Physics Letters, Vol. 25, No. 4, 15 August 1974, pages 208-210. On top of this layer and on the bottom of the chip are deposited the metallic electrodes 34 and 36 to which electrical connections 34-1 to 34-12 and 36a may be made to electrically pump the lasers individually.

Figure 1A:
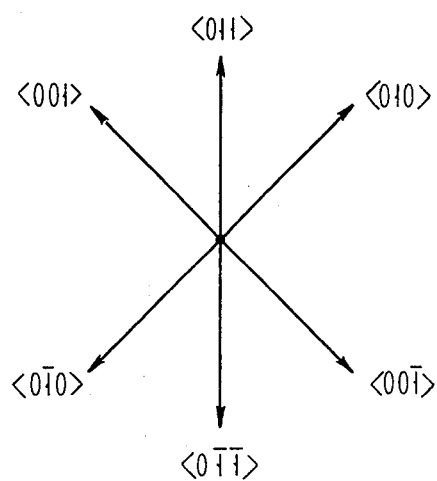
FIG. 1a shows the orientation of the crystal axes with respect to FIG. 1.
Figure 4:
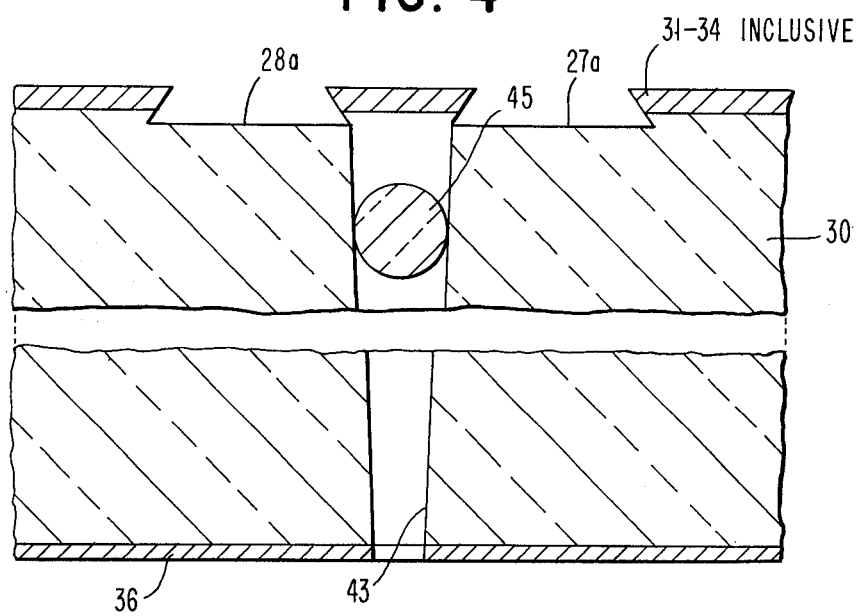
FIG. 4 is a section taken along the line 4-4 of FIG. 2 to an enlarged scale.

The top electrode is then masked in a pattern to produce the etched grooves 11b to 20b, the "B" grooves, and the grooves 23a to 32a, the "A" grooves. The V-grooves in the diffraction grating 35 for ease of reference are referred to as the "C" grooves. All of the foregoing grooves have a predetermined relationship with the crystallographic planes so that the etching follows a preferential etch direction to produce accurately disposed planes. It was stated previously that the (100) plane was up and the ($\bar{1}$00) plane was down with respect to the chip orientation. The "B" grooves are oriented with respect to the crystal axes shown in FIG. 1a such that the resulting etched walls provide the reflection surfaces for the laser beams in a circulatory path bounded by the crystal planes (010), (00$\bar{1}$), (0$\bar{1}$0), (001). These planes are all perpendicular to the (100) plane. The sectional view in FIG. 4 shows the "A" grooves 27a and 28a as being dovetailed. This is the result of the etchant following the ($\bar{1}\bar{1}\bar{1}$) and ($\bar{1}$11) planes which are disposed at an angle of approximately 35° with respect to normal to the (100) plane. These angles foil any attempted oscillation using these planes. Both the A and B grooves are etched to a depth at least to the interface between the substrate 30 and the layer 31.

Because of the difficulty of representing the various layers to scale it appears that the dovetailed grooves in FIG. 4 completely undercut the islands. However since they are only 2 micrometers in depth, as shown in the table of values to follow, the undercutting of a 35° sloping wall is minimal.

Figure 3:
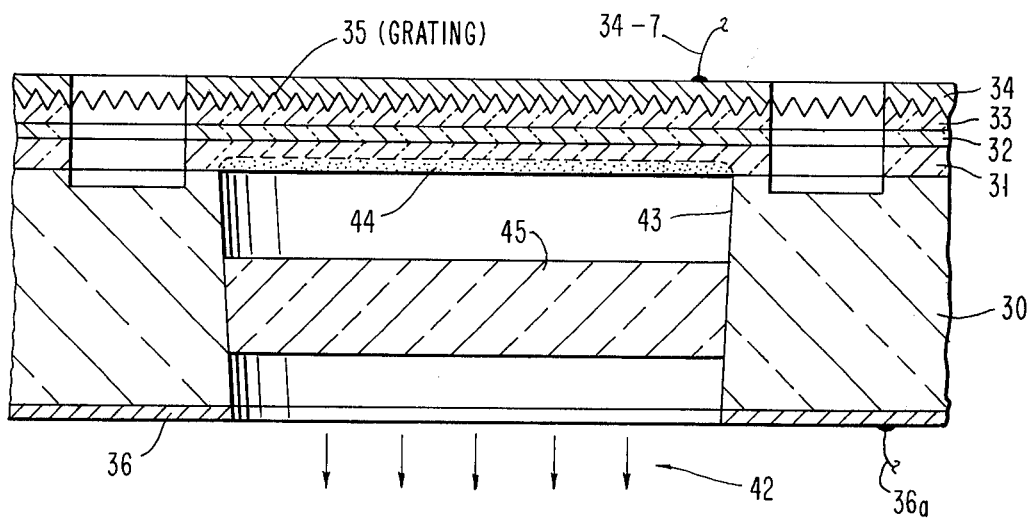
FIG. 3 is a section taken along the line 3—3 of FIG. 2.

The normal lasing action for a DH laser occurs in the active layer 32 and the radiation exits in a direction parallel to the plane of the layer. In the instant invention, the lasing action occurs in the same layer with the surfaces 37, 38, 39, and 40 providing total internal reflection for the lowest loss laser oscillation. The grating 35 is such that second order diffraction is utilized for both feedback and narrow band wavelength selection. First order diffraction is utilized to give a wide aperture output beam 42 normal to the plane of the waveguide, as shown in FIGS. 3 and 4. To reduce the attentuation of the beam, the substrate 30 is etched with a plurality of apertures 43 through the common electrode to 36 to a depth to bare the layer 31. Selective etches will differentiate between the substrate and the GaAlAs to stop the etching at the interface.

An example of a typical structure constructed as hereinabove described has the following parameters:

Thickness of substrate 30 ~: 100μm
Thickness of lower buffer layer 31: 1μm
Thickness of active layer 32: 0.2μm
Thickness of upper buffer layer 33: 0.3μm
Periodicity of grating: 0.25μm
Depth of grating grooves: 0.15μm
Width of "B" grooves: 25μm
Depth of "B" grooves in dielectric material: 2μm
Width of "A" grooves at surface: − 25μm
Effective perimeter of lasing path in one island: = 500 to 1000μm.

The foregoing is but one example of a typical embodiment. Other combinations of parameters and geometrics will be apparent to one skilled in the art, including the formation of Fresnel or holographic lens on the surface of the exit layer to direct the radiation into the most efficient exit path. The lower face of the lower buffer layer, after it is exposed by etching of the hole through the substrate, can be anodized to place an anti-reflection layer 44 on the exit surface. The addition of a fiber lens 45 in the exit slot can be utilized to control the diverge of the radiation due to the filaments.

While the invention has been particularly shown and described with reference to preferred embodiment, it will be understood by those skilled in the art that various changes in form and detail may be made therein without departing from the spirit of the invention.

What is claimed is:

1. A solid state laser array comprising:
    a monolithic body having a plurality of planar layers of semiconducting materials including an active layer bounded by a pair of buffer layers operative when forward biased to produce a population inversion;
    electrode structures on opposing faces of said body operative when potentialized to apply a forward bias to said active layer;
    a plurality of grooves opening into one of the faces of said body and penetrating into said body to a depth equal to or greater than the depth of the lower buffer layer the said grooves dividing said body into a plurality of islands each of which is bounded by walls of said grooves to provide a resonant circulatory cavity;
    a diffraction grating formed in a layer of said body for coupling the circulating laser beam out of each of said laser islands in a direction normal to the plane of said layers;
    the said plurality of grooves consisting of first, second, and third sets of grooves, the grooves in the respective sets being parallel to one another, and the first and second sets of grooves being mutually perpendicular and equiangularly disposed with respect to the grooves in said third set, the grooves in said first and second sets having vertical walls and the grooves in said third set having nonvertical walls whereby the resonating cavity is defined by the walls of said first and second sets of grooves.

2. The array of claim 1 wherein walls of said first set of grooves are coplanar with the (001) and (00$\bar{1}$) crystal planes, the walls of said second set of grooves are coplanar with the (010) and (0$\bar{1}$0) crystal planes, the walls of said third set of grooves are coplanar with the ($\bar{1}\bar{1}\bar{1}$) and ($\bar{1}$11) crystal planes, and the surfaces of said diffraction grating are coplanar with the (11$\bar{1}$) and (1$\bar{1}$1) crystal planes, and the respective layers and functions are all parallel to the (100) crystal plane.

* * * * *